United States Patent
Dyvorne et al.

(10) Patent No.: US 10,429,473 B2
(45) Date of Patent: Oct. 1, 2019

(54) METHODS FOR PRODUCING A SLICE-SELECTIVE ADIABATIC $T_2$ PREPARATION PULSE AND DEVICES THEREOF

(71) Applicant: Icahn School of Medicine at Mount Sinai, New York, NY (US)

(72) Inventors: Hadrien Dyvorne, Branford, CT (US); Priti Balchandani, New York, NY (US)

(73) Assignee: Icahn School of Medicine at Mount Sinai, New York, NY (US)

( * ) Notice: Subject to any disclaimer, the term of this patent is extended or adjusted under 35 U.S.C. 154(b) by 343 days.

(21) Appl. No.: 15/067,507

(22) Filed: Mar. 11, 2016

(65) Prior Publication Data

US 2017/0261585 A1   Sep. 14, 2017

(51) Int. Cl.
| | | |
|---|---|---|
| *G01R 33/56* | (2006.01) | |
| *G01R 33/54* | (2006.01) | |
| *G01R 33/483* | (2006.01) | |
| *G01R 33/563* | (2006.01) | |
| G01R 33/485 | (2006.01) | |

(52) U.S. Cl.
CPC ........ *G01R 33/5602* (2013.01); *G01R 33/485* (2013.01); *G01R 33/4833* (2013.01); *G01R 33/56341* (2013.01)

(58) Field of Classification Search
CPC .............. G01R 33/4833; G01R 33/485; G01R 33/5602; G01R 33/56341; G01R 33/50; G01R 33/586; A61B 5/055
See application file for complete search history.

(56) References Cited

U.S. PATENT DOCUMENTS

| | | | | |
|---|---|---|---|---|
| 2009/0137897 A1* | 5/2009 | Balchandani | ............ | A61B 5/05 600/410 |
| 2009/0230958 A1* | 9/2009 | Balchandani | ...... | G01R 33/4833 324/309 |
| 2013/0342206 A1* | 12/2013 | Ugurbil | .............. | G01R 33/4835 324/309 |

OTHER PUBLICATIONS

Dyvorne, Hadrien, and Priti Balchandani. "Slice-selective adiabatic magnetization T2-preparation (SAMPA) for efficient T2-weighted imaging at ultrahigh field strengths." Magnetic resonance in medicine 76.6 (Dec. 2015): 1741-1749. (Year: 2015).*

(Continued)

*Primary Examiner* — Rishi R Patel
(74) *Attorney, Agent, or Firm* — Pepper Hamilton LLP

(57) ABSTRACT

A method, magnetic resonance imaging computing device, and a non-transitory computer readable medium for producing a slice-selective adiabatic magnetization $T_2$ preparation pulse for magnetic resonance imaging. A pulse control signal including an adiabatic half passage pulse control signal, an adiabatic full passage pulse control signal, and a reverse adiabatic half passage pulse control signal is generated. A plurality of slice-selective linear phase subpulse control signals are generated. The pulse control signal is sampled using the plurality of slice-selective linear phase subpulse control signals to generate a slice-selective adiabatic magnetization $T_2$ preparation control signal. The slice-selective adiabatic magnetization $T_2$ preparation control signal is output to a waveform generator to produce the slice-selective adiabatic magnetization $T_2$ preparation pulse.

33 Claims, 12 Drawing Sheets

(56) References Cited

OTHER PUBLICATIONS

Balchandani et al., "Slice-Selective Tunable-Flip Adiabatic Low Peak-Power Excitation Pulse", Magnetic Resonance in Medicine vol. 59, pp. 1072-1078 (2008).
Balchandani et al., "Improved Slice-Selective Adiabatic Excitation", Magnetic Resonance in Medicine vol. 71, pp. 1-19 (2014).
Balchandani et al., Designing Adiabatic Radio Frequency Pulses Using the Shinnar-Le Roux Algorithm, Magnetic Resonance in Medicine vol. 64, pp. 843-851 (2010).
Nezafat et al., "Spectrally Selective B1-Insensitive T2 Magnetization Preparation Sequence", Magnetic Resonance in Medicine vol. 61, pp. 1326-1335 (2009).
Nguyen et al., "T2prep Three-Dimensional Spiral Imaging with Efficient Whole Brain coverage for Myelin Water Quantification at 1.5 Tesla", Magnetic Resonance in Medicine vol. 67, pp. 614-621 (2010).

* cited by examiner

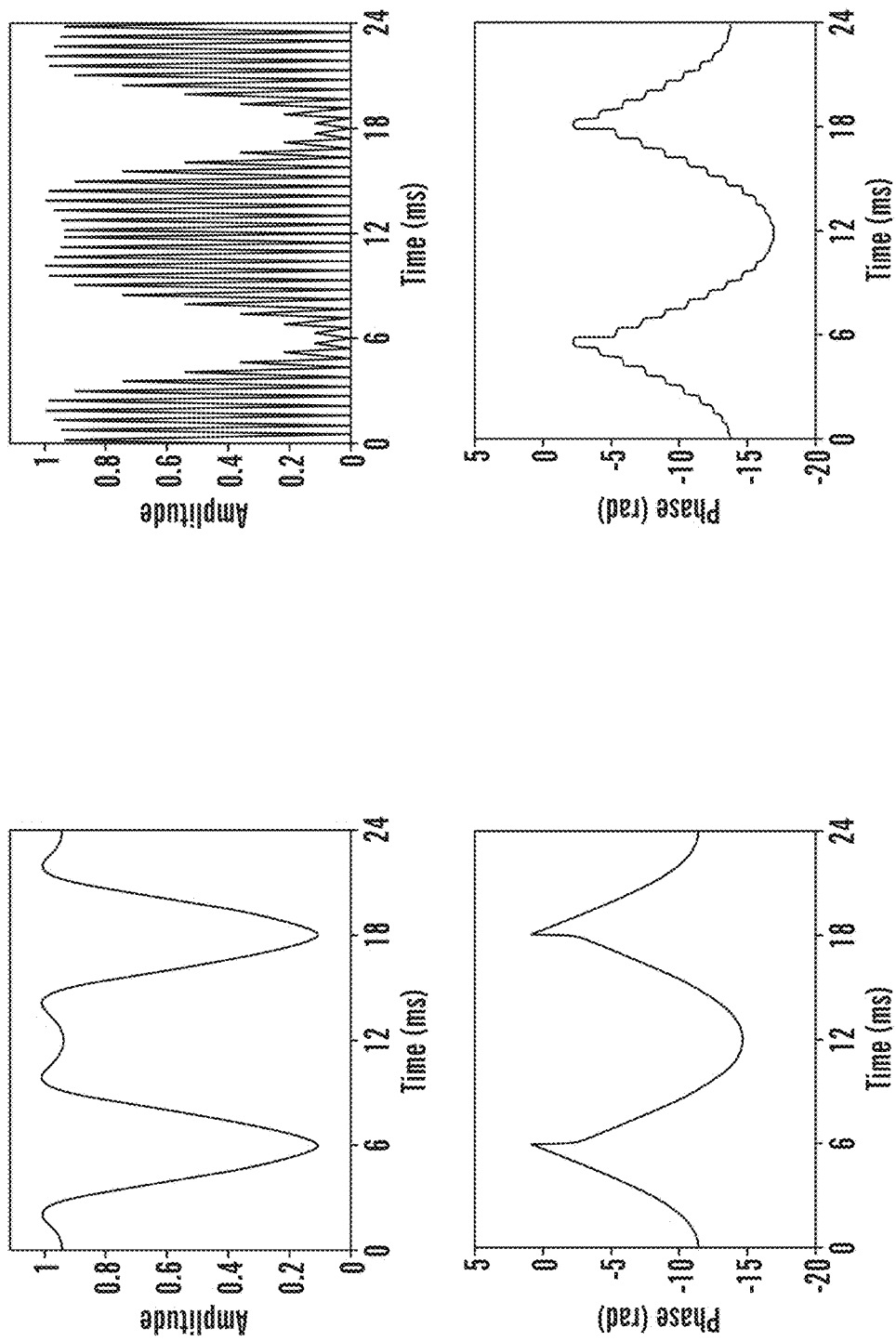

METHODS FOR PRODUCING A SLICE-SELECTIVE ADIABATIC $T_2$ PREPARATION PULSE AND DEVICES THEREOF

This invention was made with government support under grant number R00 NS070821 awarded by NIH. The government has certain rights in this invention.

FIELD

This technology generally relates to methods and devices for magnetic resonance imaging and, more particularly, to methods and devices for producing a slice-selective adiabatic magnetization preparation (SAMPA) pulse for $T_2$-weighted and diffusion-weighted imaging.

BACKGROUND

Magnetic resonance imaging at high-field, e.g., 3-4.7 T, and ultra-high field, 7 T and above, strengths is a natural and sustained evolution for the use of magnetic resonance imaging as a diagnostic tool, since higher field strengths lead to higher signal levels and improved image quality. However, physical limitations stand in the way of fully efficient high-field and ultra-high field imaging protocols.

$T_2$-weighted ($T_2W$) imaging is one of the most useful and fundamental types of imaging methods for magnetic resonance imaging clinical routines. Performing $T_2W$ imaging of the brain, however is a challenge at ultra-high field strengths of 7 T or higher. Specifically, at high field, $T_2W$ imaging is limited by transmit field inhomogeneity and increased radiofrequency power deposition.

A popular method for $T_2W$ imaging is turbo spin echo, which offers fast acquisitions using multiple refocusing radiofrequency pulses. Multi-echo spin echo sequences are used extensively to generate $T_2W$ images at 1.5 T and 3 T, but do not perform optimally at ultra-high field strengths.

First, multi-spin echo sequences prescribe a large flip angle, which is extremely sensitive to the $B_1$ inhomogeneity present at a field strength of 7 T. The inhomogeneous transmit field leads to signal loss and variable $T_2$ contrast across the imaged volume.

Second, refocusing radiofrequency pulses uses large amounts of power to achieve slice selectivity and the large flip angles associated with multi-spin echo sequences. This leads to high power deposition and limited scan efficiency. Specifically, the large radiofrequency power deposited by the refocusing pulses, leads to significant increases in required scan time in order to remain below specific absorption rate (SAR) limitations at 3 T and above.

Diffusion-weighted (DW) imaging is another important technique in magnetic resonance imaging. DW imaging is used to characterize lesion malignancy and to visualize neuronal fiber orientation and integrity. Standard DW imaging sequences use the spin echo as a basic building block, which leads to similar issues as $T_2W$ imaging when employing DW imaging sequences at ultra-high field strengths.

One alternative to spin-echo-based $T_2W$ and DW imaging is to play a $T_2$ magnetization preparation ($T_2$-prep) followed by a fast imaging acquisition. Although utilizing $T_2$-prep provides a significantly lower power usage, the $T_2$-prep method has a high sensitivity to $B_0$ and $B_1$ inhomogeneity, which results in signal loss and banding artifacts due to incomplete refocusing or imperfect tip-down or tip-up projections. Advanced radiofrequency pulse designs have been proposed to improve robustness of the $T_2$-prep method. However, all such designs perform $T_2$ weighting in the whole imaged volume, resulting in inefficient acquisitions because of long repetition times required for $T_1$ recovery.

SUMMARY

A method for producing a spatially selective fully adiabatic $T_2$ preparation pulse for magnetic resonance imaging. A pulse control signal including an adiabatic half passage pulse control signal, an adiabatic full passage pulse control signal, and a reverse adiabatic half passage pulse control signal is generated by a magnetic resonance imaging computing device. A plurality of slice-selective linear phase subpulse control signals are generated by the magnetic resonance imaging computing device. The pulse control signal is sampled using the plurality of slice-selective linear phase subpulse control signals to generate a slice-selective adiabatic magnetization $T_2$ preparation control signal. The slice-selective adiabatic magnetization $T_2$ preparation control signal is output to a waveform generator to produce the slice-selective adiabatic magnetization $T_2$ preparation pulse.

A magnetic resonance imaging computing device includes at least one processor and a memory coupled to the processor which is configured to be capable of executing programmed instructions comprising and stored in the memory to generate a pulse control signal including an adiabatic half passage pulse control signal, an adiabatic full passage pulse control signal, and a reverse adiabatic half passage pulse control signal is generated by a magnetic resonance imaging computing device. A plurality of slice-selective linear phase subpulse control signals are generated. The pulse control signal is sampled using the plurality of slice-selective linear phase subpulse control signals to generate a slice-selective adiabatic magnetization $T_2$ preparation control signal. The slice-selective adiabatic magnetization $T_2$ preparation control signal is output to a waveform generator to produce the slice-selective adiabatic magnetization $T_2$ preparation pulse.

A non-transitory computer readable medium having stored thereon instructions for producing a spatially selective fully adiabatic $T_2$ preparation pulse for magnetic resonance imaging comprises executable code which when executed by a processor, causes the processor to perform steps including generating a pulse control signal including an adiabatic half passage pulse control signal, an adiabatic full passage pulse control signal, and a reverse adiabatic half passage pulse control signal. A plurality of slice-selective linear phase subpulse control signals are generated. The pulse control signal is sampled using the plurality of slice-selective linear phase subpulse control signals to generate a slice-selective adiabatic magnetization $T_2$ preparation control signal. The slice-selective adiabatic magnetization $T_2$ preparation control signal is output to a waveform generator to produce the slice-selective adiabatic magnetization $T_2$ preparation pulse.

The present technology advantageously provides a slice-selective adiabatic magnetization $T_2$ preparation (SAMPA) pulse that allows for efficient and robust acquisitions for $T_2$-weighted imaging at high field. In particular and by way of example, the present technology may be utilized in a variety of different applications, including for efficient brain $T_2$-weighted imaging at 7 T. The present technology provides increased flexibility in protocol design and higher efficiency when using interleaved slice or slab acquisitions.

BRIEF DESCRIPTION OF THE FIGURES

FIGS. 3A-3C illustrate a radiofrequency pulse and sequence design for a SAMPA pulse of the present technology. FIG. 3A shows the amplitude (top) and phase (bottom) of a BIR4 envelope designed using the adiabatic Shinnar-Le Roux algorithm. FIG. 3B illustrates the amplitude (top) and phase (bottom) of a SAMPA pulse derived from the BIR4 pulse. FIG. 3C shows a pulse sequence for T2-prepared fast gradient echo sequence with low flip angle imaging.

FIG. 7A shows an evaluation of SAMPA-FLASH for $T_2$ measurement against spin echo acquisition $T_E$=25, 50, 75 and 100 ms (from left to right). FIG. 7B illustrates correlation between $T_2$ measurements when compared with spin echo imaging ($R^2$=0.999). FIG. 7C shows slice selectivity at 10, 20 and 30 mT/m gradient strength (from left to right), measured by setting a SAMPA slice gradient orthogonal to a FLASH slice gradient.

DETAILED DESCRIPTION

Figure 1:
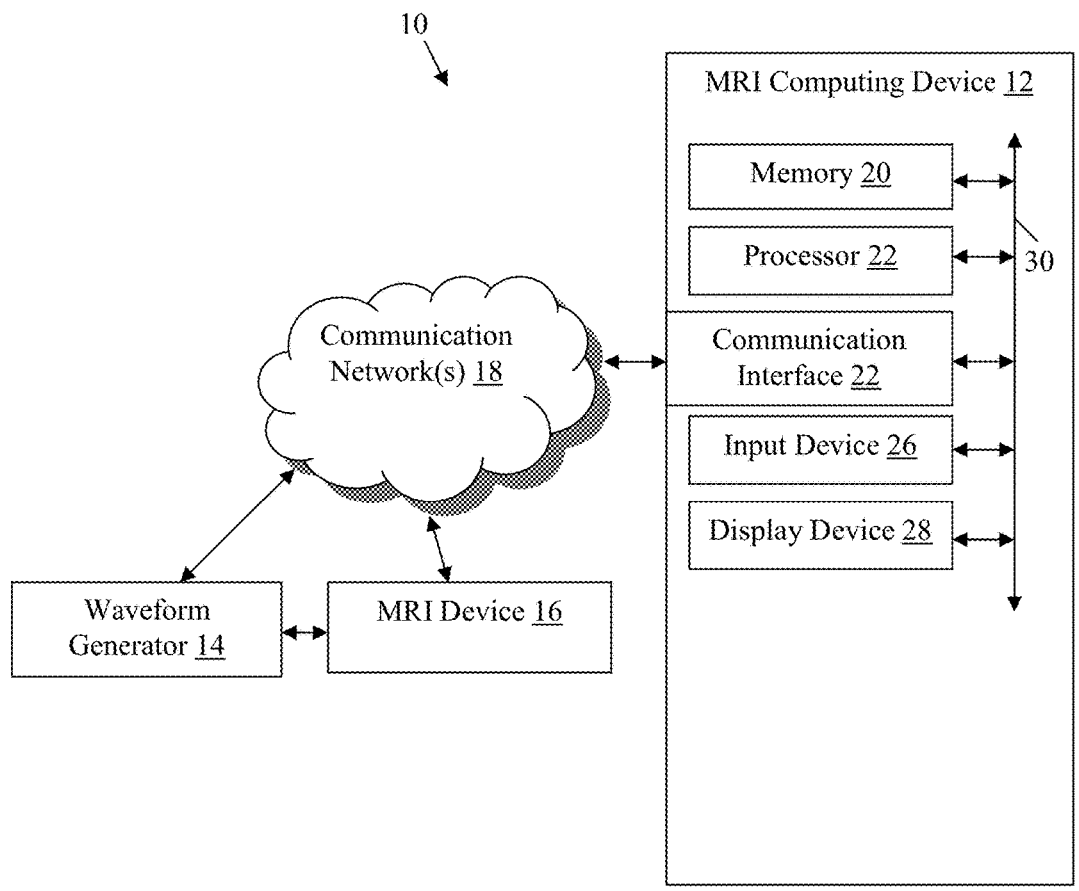
FIG. 1 is an exemplary environment including a magnetic resonance imaging computing device of the present technology.

An exemplary environment 10 for producing a spatially selective fully adiabatic $T_2$ preparation pulse for magnetic resonance imaging including a magnetic resonance imaging (MRI) computing device 12 coupled to a wave generator 14, which is in communication with an MRI device 16, by communication network(s) 18 is illustrated in FIG. 1. While not shown, the environment also may include additional components whose connections and operations are well known to those of ordinary skill in the art of magnetic resonance imaging and thus will not be described here. This technology provides a number of advantages including methods, non-transitory computer readable media, and devices that more effectively provide a spatially selective fully adiabatic T2 preparation (SAMPA) pulse for magnetic resonance imaging. The SAMPA pulse allows for efficient and robust acquisitions for $T_2$-weighted imaging at high field strengths.

Further the SAMPA pulse of the present technology may be utilized in a number of possible applications with a variety of readouts including balanced steady state free precession, spiral, and SPACE magnetic resonance imaging sequences. The slice selectivity of the SAMPA pulse of the present technology may also be leveraged to increase the efficiency of applications such as diffusion-prepared imaging, fluid-attenuated inversion recovery, and $T_2$-prepared blood oxygen level dependent imaging.

Referring more specifically to FIG. 1, the Mill computing device 12 in this example is configured to be capable of providing pulse control signals as illustrated and described with examples of the methods described herein. The Mill computing device 12 includes at least a processor 20, a memory 22, a communication interface 24, an input device 26, and a display device 28, which are coupled together by a bus 30 or other communication link, although other numbers and types of systems, devices, components, and elements in other configurations and locations can be used.

The processor 20 in the Mill computing device 12 executes a program of instructions stored in the memory for one or more aspects of the present technology, although other numbers and types of systems, devices, components, and elements in other configurations and locations can be used. The communication interface 24 of the MRI computing device 12 is used to operatively couple and communicate between the Mill computing device 12 and the waveform generator 14 via a communication network or other communication link, although the communications network(s) could also be used in other examples and other types and numbers of communication networks or systems with other types and numbers of connections and configurations can be used.

The memory 22 in the magnetic resonance imaging computing device stores these programmed instructions for one or more aspects of the present technology, although some or all of the programmed instructions could be stored and/or executed elsewhere. A variety of different types of memory storage devices, such as a random access memory (RAM), read only memory (ROM), hard disk, CD ROM, DVD ROM, or other computer readable medium which is read from and written to by a magnetic, optical, or other reading and writing system that is coupled to the processor 20, can be used for the memory 22.

The communication interface 24 of the Mill computing device 12 is used to operatively couple and communicate between the Mill computing device 12 and the waveform generator 14 and the Mill device 16 via the communications network(s) 18, although other types and numbers of communication networks, systems, or other links with other types and numbers of connections and configurations can be used. By way of example only, the communications network could use TCP/IP over Ethernet and industry-standard protocols, including NFS, CIFS, SOAP, XML, LDAP, and SNMP, although other types and numbers of communication networks, such as a direct connection, a local area network, a wide area network, modems and phone lines, e-mail, and wireless communication technology, each having their own communications protocols, can be used.

The input 26 and display devices 28 of the MRI computing device 12 enable a user to interact with the MRI computing device 12, such as to input and/or view data and/or to configure, program, and/or operate the MRI computing device 12 by way of example only. The input device 26 may include a keyboard, computer mouse, and/or touch screen and the display device 28 may include a computer monitor, although other types and numbers of input devices and/or display devices could also be used in other examples.

The waveform generator 14 is a standard waveform generator capable of producing radiofrequency pulses in accordance with the examples of methods illustrated and described herein. The MRI device 16 is a standard magnetic resonance imaging device, such as, by way of example only a 7 T actively shielded whole body MRI scanner (Siemens MAGNETOM 7 T, Siemens, Erlangen), equipped with a SC72CD gradient coil (Gmax=70 mT/m and max slew rate=200 T/m/s), using a single channel transmitter and a 32-channel receive head coil (Nova Medical, Wilmington, Mass.).

Although an example of the MRI computing device 12, is described herein, this system can be implemented on any suitable computer system or computing device. It is to be understood that the devices and systems of the examples described herein are for exemplary purposes, as many variations of the specific hardware and software used to implement the examples are possible, as will be appreciated by those skilled in the relevant art(s).

Aspects of the examples may also be embodied as a non-transitory computer readable medium having instructions stored thereon for one or more aspects of the present technology as described and illustrated by way of the examples herein, as described herein, which when executed by a processor, cause the processor to carry out the steps necessary to implement the methods of the examples, as described and illustrated herein.

Exemplary methods, non-transitory computer readable medium, and devices for producing a slice-selective adiabatic magnetization $T_2$ preparation pulse for $T_2$-weighted magnetic resonance imaging in accordance with the present technology will now be described herein.

Figure 2:
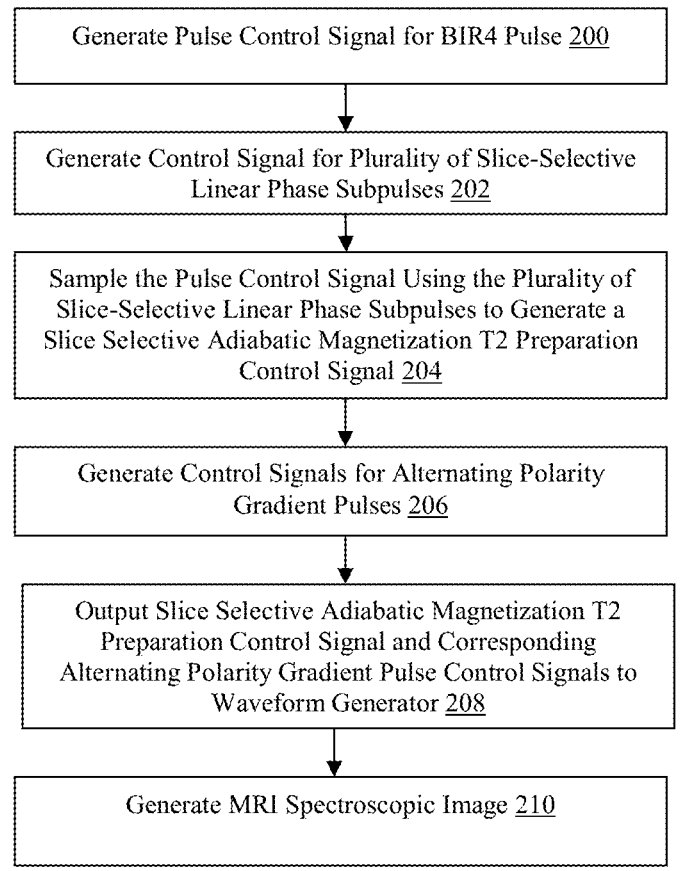
FIG. 2 is a flowchart illustrating a method for producing a spatially selective fully adiabatic T2 preparation pulse for magnetic resonance imaging in accordance with the present technology.

Referring now to FIG. 2, a flowchart of an example of a method of developing a spatially selective fully adiabatic $T_2$ preparation (SAMPA) pulse for magnetic resonance imaging is illustrated. In step 200 the MRI computing device 12 generates a pulse control signal for the waveform generator 14 to produce a $B_1$ insensitive rotation (BIR4) pulse, although other types and numbers of control signals may be generated by the MRI computing device 12 to produce other types and numbers of radiofrequency pulses. By way of example only, the pulse control signal may be generated using a MATLAB script as produced by Mathworks, Inc., Natick, Mass., although other scripts capable of generating the pulse control signal may be utilized.

In this example the pulse control signal for the BIR4 pulse comprises an adiabatic half passage (AHP) pulse control signal, an adiabatic full passage (AFP) pulse control signal, and a reverse adiabatic half passage (rAHP) pulse control signal to produce a AHP pulse, AFP pulse, and a rAHP pulse, respectively, which make up the BIR4 pulse, although the control signal may be configured to produce, with the waveform generator 14, other types and numbers of pulses.

The BIR4 pulse formed from the pulse control signal is optimized for use in the present technology as described below. The BIR4 pulse may be derived from an adiabatic full passage (AFP) 180 degree pulse generated using the adiabatic Shinnar-Le Roux algorithm, such as described in Balchandani et al., "Designing Adiabatic Radio Frequency Pulses Using the Shinnar-Le Roux Algorithm," Magn Reson Med 71:75-82 (2014), the disclosure of which is hereby incorporated herein by reference in its entirety, although other methods may be utilized. In this example, the AFP 180 degree pulse from which the BIR4 pulse is derived has a duration of about 12 ms and a bandwidth of about 960 Hz, although other parameters may be utilized.

The AFP 180 degree pulse from which the BIR4 pulse is derived is formed by generating a linear Shinnar-Le Roux pulse as described in Pauly et al., "Parameter Relations for the Shinnar-Le Roux Selective Excitation Pulse Design Algorithm [NMR imaging]," IEEE Trans Med Imaging 10(1):53-65 (1991), the disclosure of which is hereby incorporated by reference herein in its entirety. In one example, quadratic phase is overlaid on the spectral domain of the linear radiofreqency pulse to induce adiabatic behavior as indicated in equation (1) as follows:

$$F(\omega)=F_0(\omega)e^{ik\omega^2} \quad (1)$$

with $F_0$ and F the spectral domains of the linear and adiabatic pulses, respectively, and a quadratic phase strength of $k=5.11 \cdot 10^{-4}$ s$^2$, although other parameters may be utilized.

The inverse Shinnar-Le Roux transform is then applied to the Fourier transform of $F(\omega)$ to yield the amplitude and phase of the radiofrequency pulse. The pulse is then truncated at 10% of its peak amplitude to improve efficiency, while maintaining an undistorted magnetization profile. The generated AFP 180 degree pulse, by way of example, provides $B_1$ independent inversion for $B_1$ values above a 5.3 µT adiabatic threshold.

Next, to generate the BIR4 pulse of the pulse control signal, the AFP 180 degree pulse is cut in half to provide the AHP pulse and the rAHP pulse. The AHP pulse and the rAHP pulse are combined in series along with the AFP 180 degree pulse to make up the BIR4 pulse of the pulse control signal as shown in FIG. 3A, which illustrates the amplitude (top) and phase (bottom) of the pulse control signal. In this example, the resulting BIR4 pulse of the pulse control signal has a duration of about 24 ms, although other parameters for the BIR4 pulse may be utilized.

In step 202, the MRI computing device 12 generates a plurality of slice-selective linear phase subpulse control signals for the waveform generator to create the plurality of slice-selective linear phase subpulses. The subpulses, by way of example only, may be Hamming-windowed sinc pulses with a time bandwidth product of 1, although other types and/or numbers of subpulses with other parameters may be utilized. In one example, the MRI computing device 12 generates at least 44 subpulse control signals, although other numbers of subpulse control signals may be generated.

In step 204, the MRI computing device 12 samples the pulse control signal configured to form the BIR4 envelope using the plurality of slice-selective linear phase subpulse control signals generated in step 202 to generate a slice-selective adiabatic magnetization $T_2$ preparation (SAMPA) control signal, although other sampling techniques may be utilized. By way of example only, the BIR4 envelope may be sampled using at least 44 subpulses over the 24 ms long waveform. In this example, the sampling results in spectral aliasing for the generated SAMPA control signal occurring at 1.83 kHz, which is larger than the initial BIR4 bandwidth and therefore minimally alters the off-resonance behavior of the initial BIR4 envelope. The amplitude (top) and phase (bottom) of the SAMPA pulse generated by the SAMPA control signal is illustrated in FIG. 3B Next, in step 206, the MRI computing device generates an alternating polarity gradient pulse control signal for the waveform generator 14 to generate an alternating polarity gradient pulse for the slice-selective adiabatic magnetization $T_2$ preparation pulse. By way of example, trapezoidal gradient waveforms may be utilized. The gradient pulse waveforms may be generated based on a required slice thickness range. In one example, 3D slab selection is achieved using shorter ramps (82 µs) allowing for a slab thickness of 10 mm or higher. In another example, for 2D applications, larger ramp times (190 µs) are utilized to perform slice selection as thin as 3 mm while operating within the gradient hardware slew rate limit (200 mT/m/ms). In one example, the radiofrequency subpulses are reshaped using the VERSE method as described in Connolly et al., "Variable-Rate Selective Excitation," J Mang Reson 78:440-458 (1988), the disclosure of which is hereby incorporated herein by reference in its entirety, in order to perform radiofrequency excitation during gradient ramps.

In step 208, the MRI computing device 12 outputs the completed SAMPA control signal, with the associated control signals for the associated alternating polarity gradient pulse to the waveform generator 14 to be used in an imaging sequence. The SAMPA pulse may be utilized in a number of different imaging sequence applications including, by way of example only, balanced steady state free precession, spiral, and SPACE magnetic resonance imaging sequences In step 210, an MRI spectroscopic image is generated using the output SAMPA pulse control signal and gradient pulse control signals. In one example, the SAMPA pulse is combined with a radiofrequency-spoiled fast gradient echo sequence with low flip angle (FLASH) as described in Haase, "Snapshot FLASH MRI. Applications to T1, T2, and Chemical-Shift Imaging," Magn Reson Med 13(1):77-89 (1990), the disclosure of which is incorporated herein by reference in its entirety. Because the FLASH signal is acquired in a transient state following $T_2$-prep using the SAMPA pulse, center-out acquisition of k-space may be implemented. In addition, the acquisition may be segmented into shorter trains in order to limit blurring occurring with magnetization-prepared FLASH as described in Nolte et al., "Rapid Isotropic Diffusion Mapping Without Susceptibility Artifacts: Whole Brain Studies Using Diffusion-Weighted Single-Shot STEAM MR Imaging," Magn Reson Med 44(5):731-736 (2000), the disclosure of which is incorporated herein by reference in its entirety.

Figure 3C:
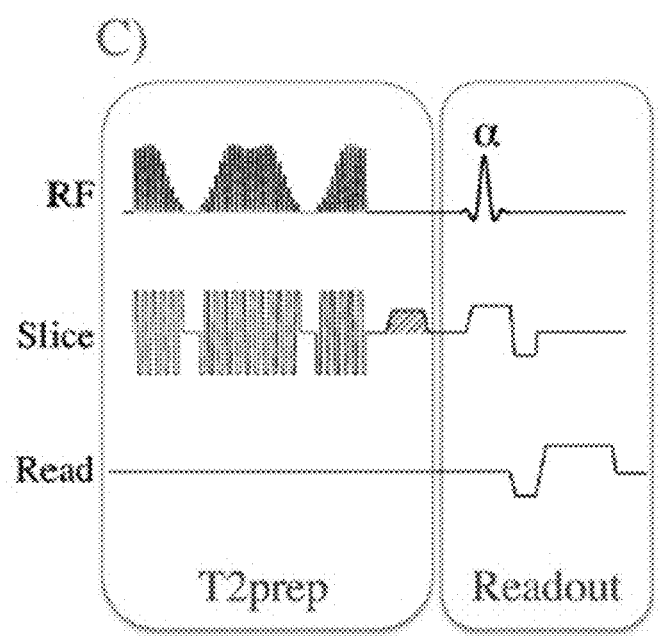

The excitation pulses used for FLASH acquisition may be, by way of example, 10° flip angle SLR pulses with time band width of 6 and 1 ms duration for 2D imaging, and a time bandwidth of 12 and 2 ms duration for 3D imaging. Slice-selection gradients are adjusted to excite a section that was half of the thickness achieved by the SAMPA $T_2$-prep in order to avoid transient contrast occurring at the edges of the SAMPA selection profile. The full SAMPA-FLASH sequence diagram is shown in FIG. 3C. Waiting periods are inserted between the SAMPA pulse sections to achieve a given echo time $T_E$ and a spoiler gradient is inserted after the SAMPA pulse to suppress residual transverse magnetization.

The present technology provides a $T_2$-prep module to perform slice- or slab selective $T_2$ preparation while being relatively immune to $B_0$ and $B_1$ inhomogeneity at high fields, such as 7 T, by way of example. This enables the development of fast, interleaved 2D multi-slice or 3D multi-slab $T_2$-prepared acquisitions that provide improved signal to noise ratio efficiency compared to standard acquisitions using non-selective $T_2$-prep modules. $T_2$ contrast is essential for structural imaging and has strong diagnostic value. Because it employs fewer refocusing pulses, a $T_2$-prepared FLASH sequence has lower power deposition than a turbo spin echo (TSE) acquisition, by way of example, 1.4 W/kg vs 7.0 W/kg for 2D TSE, and thus allows for whole brain coverage.

EXAMPLES

The following examples are merely intended to illustrate practice of examples of the invention, and are not intended to limit the scope of the claimed invention. Simulations as well as phantom and in vivo results, demonstrate multi-slice capability and improved $B_1$-insensitivity of the SEAMS PINS pulse-pair when operating at RF amplitudes of up to 40% above adiabatic threshold.

Bloch Simulations

The performance of the $T_2$-prep for slice selection and its dependence on $B_0$ and $B_1$ variations were analyzed using Bloch simulation programs in Matlab. The off-resonance behavior, B1 robustness, and slice selectivity of the novel $T_2$ preparation module were analyzed. $T_1$ and $T_2$ values were set to 1000 ms and 60 ms respectively. The longitudinal component of the magnetization $m_Z$ at the end of the $T_2$-prep was computed.

Three sets of simulations were performed in order to characterize: 1) the performance of non-selective BIR4 and SAMPA as a function of peak $B_1$, 2) the effect of $B_1$ on SAMPA slice profiles for a peak $B_1$ ranging from 15-24 µT (reflecting the 23 µT maximum $B_1$ 7 T transmit head RF coil), and 3) the effect of $T_2$-prep length on the observed signal and contrast.

All of the performed simulations used a temporal resolution of 4 µs. Values for $m_Z$ were evaluated for 200 frequency points ranging from −500 to 500 Hz and for 200 spatial points ranging from −10 to 10 mm.

Phantom Experiments—Methodology

All imaging experiments were performed on a whole body Magnetom 7 T scanner (Siemens, Erlangen, Germany) with 70 mT/m/ms gradient sets (200 mT/m/ms slew rate) and a 1Tx/32Rx head coil (Nova Medical, Wilmington, Mass.). Second order $B_0$ shimming was performed on a manually selected volume, and transmitter voltage was adjusted using the Bloch-Siegert technique as described in Sacolick, et al., "B1 Mapping by Bloch-Siegert Shift," Magn Reson Med 63(5):1315-1322 2010, the disclosure of which is incorporated herein by reference in its entirety, by calibrating the average flip angle in a 5 cm box placed in the center of the object. The performance of the $T_2$-prep was first characterized in a phantom containing 7 vials of various agar concentrations (0.5, 1.0, 1.5, 2.0, 3.0, 4.0 and 6.0% agar in distilled water). The vials were placed in a plastic container filled with a low permittivity fluid (corn syrup) used to achieve homogeneous $B_1$ throughout the imaged volume, and to offer a large volume for effective $B_0$ shim adjustments.

$T_2$w imaging was performed at 4 different $T_2$-prep durations $T_E$=25, 50, 75 and 100 ms. Additional imaging parameters were: 192 lines, acquired in 4 shots (48 lines per shot), effective $T_R$=8 s (repetition time between subsequent $T_2$-prep), FLASH $T_E/T_R$ 3.2/10.2 ms, resolution 0.7×0.7×2 mm³, flip angle 10°, bandwidth 130 Hz/pixel, partial Fourier 6/8, 0:32 min acquisition time per measured $T_2$ weighting.

In order to compare $T_2$ values with standard sequences, spin echo imaging was performed on the same phantom with $T_E$=25, 50, 75 and 100 ms, $T_R$=4 s, resolution 0.7×0.7×3.5 mm$^3$, bandwidth 200 Hz/pixel, partial Fourier 6/8, 9:30 min acquisition time per $T_2$ weighting.

$T_2$ maps were derived offline using custom scripts written in Matlab, by fitting the decay curves for each pixel using linear regression. Following map reconstruction, $T_2$ values were measured in each agar vial by placing a rectangular region of interest on the $T_2$ maps. The $T_2$ values obtained with spin echo and SAMPA methods were compared using linear regression and Pearson correlation.

In Vivo Studies—Methodology

Two volunteers were scanned at 7 T after giving informed consent. In the first volunteer, SAMPA was evaluated against 3 other $T_2$-prep strategies: 1) MLEV4 with four 90°-180°-90° modules, using rectangular pulses of 0.8 and 1.6 ms duration for the 90° and 180°, respectively; 2) twice-refocused adiabatic using SLR-designed full passage adiabatic pulses of 4 ms duration and rectangular tip-down and tip-up pulse of 0.5 ms duration; 3) BIR4 using the pulse envelope described in previous sections. Because these $T_2$-prep modules are not slice-selective, a long repetition time $T_R$=4 s was used to acquire 2D slices sequentially. $T_2$-prep length was set to 50 ms. FLASH imaging parameters were similar to the phantom experiments, except for parallel imaging acceleration R=2 (GRAPPA), resolution 0.8×0.8×3.5 mm$^3$, 3 shots per slice (36 lines per shot) resulting in a FLASH readout duration of 259 ms per SAMPA cycle, bandwidth 400 Hz/pixel, and FLASH TE/TR 2.82/7.20 ms. Given $T_1$ values of brain tissues at 7 T (25), such a short readout will lead to minimal blurring of the $T_2$-weighted acquisition as described in Nolte et al., "Rapid Isotropic Diffusion Mapping Without Susceptibility Artifacts: Whole Brain Studies Using Diffusion-Weighted Single-Shot STEAM MR Imaging," Magn Reson Med 44(5):731-736 (2000), the disclosure of which is incorporated herein by reference in its entirety.

To further demonstrate the potential of SAMPA for achieving efficient acquisition, a multislab 3D protocol was designed for whole brain $T_2$w imaging at 0.8 mm$^3$ isotropic resolution. 11 slabs, each of 9.6 mm thickness, were acquired in interleaved fashion with an interleaved TR=12 s (one slab acquired every 1.09 s). Each slab contained 12 partitions, resulting in effective slice resolution of 0.8 mm. All remaining protocol parameters were similar to 2D imaging previously described. Total imaging time for the multislab acquisition was 5:36 min per $T_2$ weighting. This acquisition time was limited by SAR constraints, the minimum achievable imaging time being 1:53 min without considering SAR. Four volumes were acquired in a healthy volunteer at $T_E$=25, 50, 75 and 100 ms, resulting in a 22:24 min total acquisition time.

Results—$B_1$ Response of BIR4 and SAMPA $T_2$-Prep

Figures 4A, 4B:
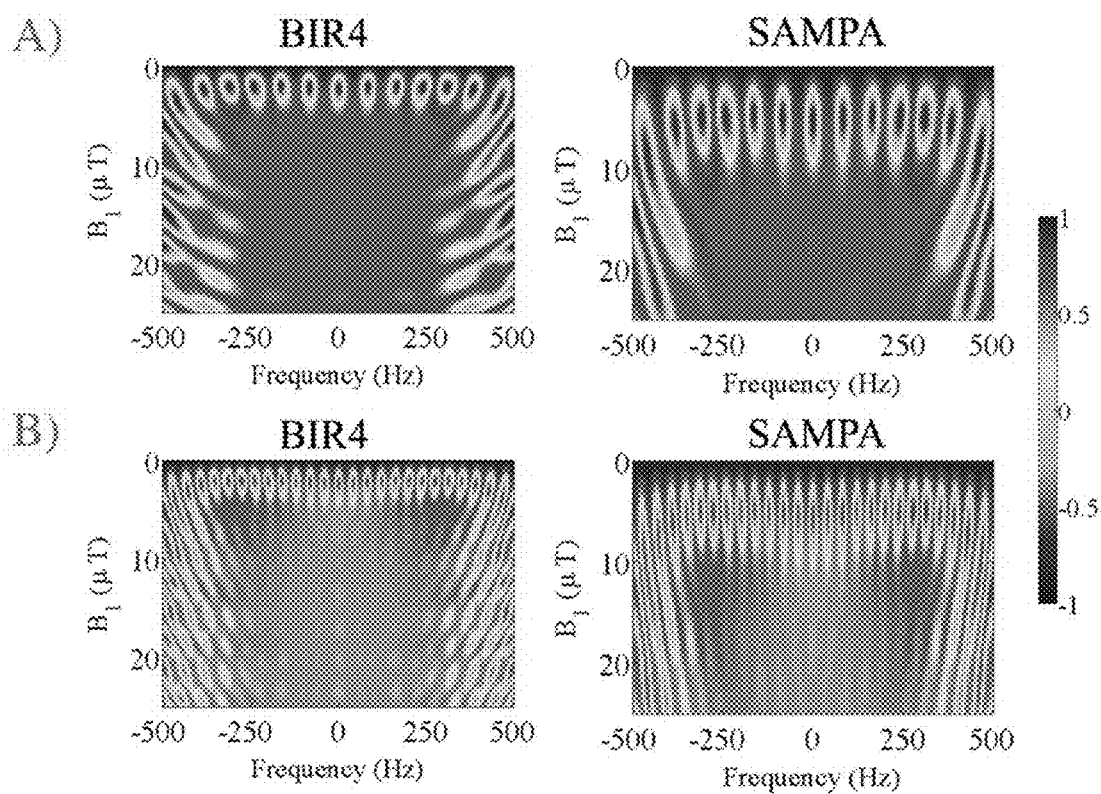
FIGS. 4A-4B illustrate a characterization of $B_1$ and off-resonance behavior of BIR4 (left) and SAMPA (right) for $T_2$-prep length of 25 ms (FIG. 4A) and 50 ms (FIG. 4B).
Figures 5A, 5B, 5C, 5D, 5E:
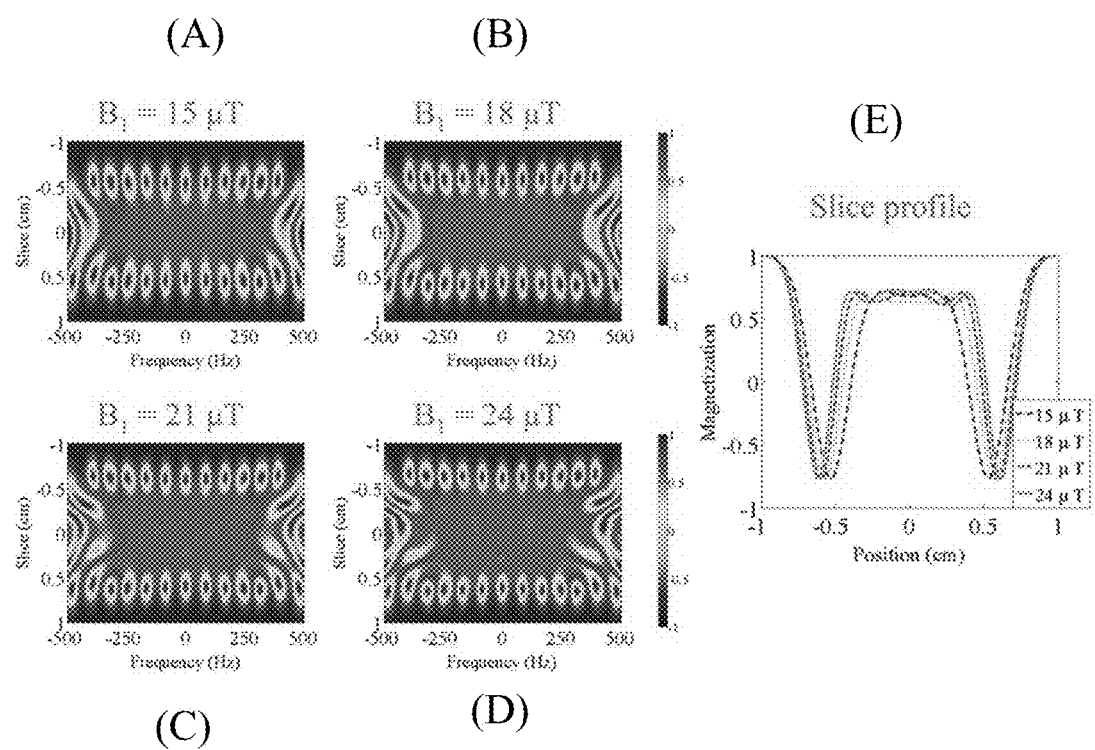
FIGS. 5A-5E illustrate off-resonance characterization of slice-selective SAMPA pulses under different $B_1$ conditions: $B_1$=15 µT (FIG. 5A), $B_1$=18 µT (FIG. 5B), $B_1$=21 µT (FIG. 5C), and $B_1$=24 µT, simulated for $T_E$=25 ms, $T_2$=60 ms, and an intensity profiles along the slice selection axis at the center frequency for all of the different $B_1$ conditions (FIG. 5E).

FIG. 4A shows the simulation results for longitudinal magnetization following a 25 ms $T_2$-prep, as a function of applied peak $B_1$ and off-resonance frequency. Both BIR4 and SAMPA show similar oscillating patterns at low $B_1$ and for frequencies outside a 500 Hz band. The $B_1$ threshold for occurrence of oscillations is higher for SAMPA (10.5 µT) than for BIR4 (4.3 µT), which is due to the reduced power efficiency of the SAMPA pulse as a result of subsampling the waveform with subpulses. Therefore, the power required to operate SAMPA in the adiabatic regime is higher than for BIR4 pulses. When increasing $T_2$-prep duration to 50 ms (FIG. 4B), a similar $B_0$-$B_1$ operating range is observed, the main difference being a decreased space between oscillatory patterns that lie outside the operating range.

Results—SAMPA Slice Selectivity

FIGS. 5A-5E show the spatial and frequency dependence of SAMPA for different applied peak $B_1$ amplitudes. There is a well-defined center slice within a 500 Hz frequency band, surrounded by similar oscillatory patterns as in FIG. 4 on the edges of the slice. When played with a selection gradient, the subpulses apply a given $B_1$ profile that has a peak in the center of the selected slice and falls down to zero at the edges of the slice. When $B_1$ inside the slice decreases below the adiabatic threshold (10.5 µT for SAMPA), BIR4 oscillations are encountered on either sides of the selected slice. In practice, extra care needs to be taken to perform the imaging within the center slice, excluding the oscillatory regions. This can be performed in a $T_2$-prep sequence by adjusting the FLASH slice selection gradient to excite the inner slice that has $T_2$w signal.

The signal within the SAMPA slice has similar intensity at different $B_1$ values ranging from 15-24 µT, which reflects the adiabatic behavior of the BIR4 envelope. There is a slight increase in slice thickness with increasing $B_1$ value, which is due to the fact that slice profiles with higher applied $B_1$ will push the transition regions further away from the center of the slice.

Figures 6A, 6B, 6C, 6D, 6E, 6F:
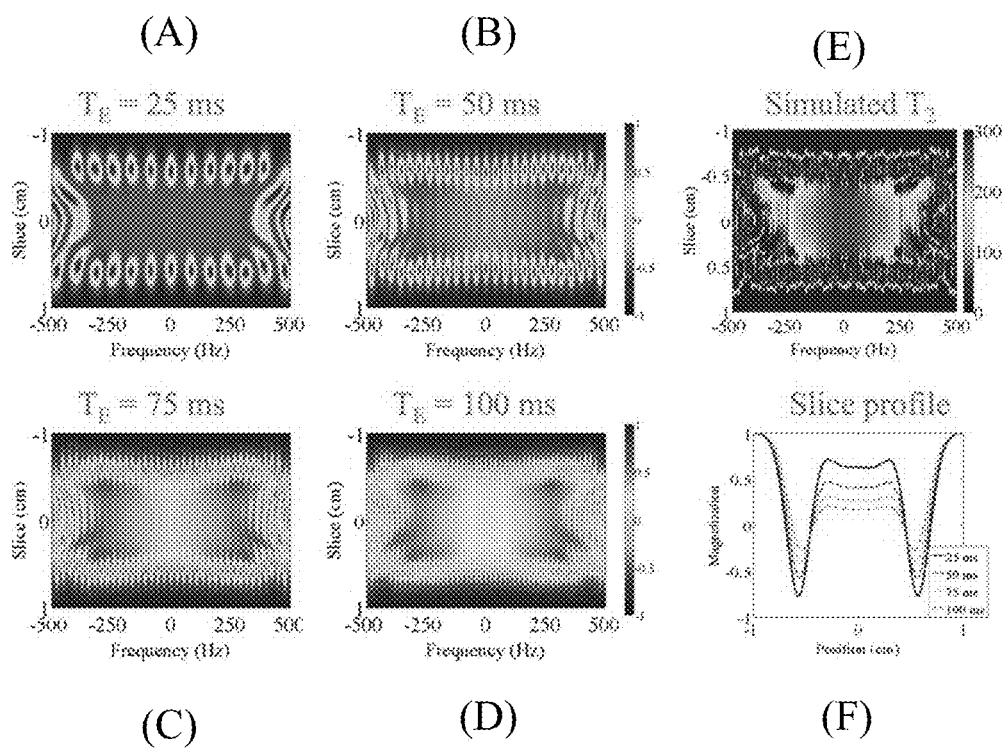
FIGS. 6A-6F illustrate a characterization of slice selectivity and off resonance profiles of SAMPA pulses at different echo times ($T_E$) simulated using $T_2$=60 ms and B1=18 µT: $T_E$=25 ms (FIG. 6A), $T_E$=50 ms (FIG. 6B), $T_E$=75 ms (FIG. 6C), $T_E$=100 ms (FIG. 6D); $T_2$ values derived from the multi-$T_E$ simulations (FIG. 6E); and an intensity profile along the slice dimension at the center frequency for each of the multi-$T_E$ simulations (FIG. 6F).

FIG. 6 shows the effect of $T_2$-prep duration (increased by inserting pauses between rAHP, AFP and AHP pulse sections) on SAMPA slice selectivity and off-resonance behavior, for an 18 µT peak $B_1$. There is decreased signal for increasing $T_2$-prep length, driven by T2 decay, while the slice intensity profile appears similar for all $T_2$-prep durations. $T_2$ weighting occurs in a 400 Hz frequency band, and is altered for frequencies larger than ±200 Hz.

Results—Phantom Experiments

Figures 7A, 7B, 7C:
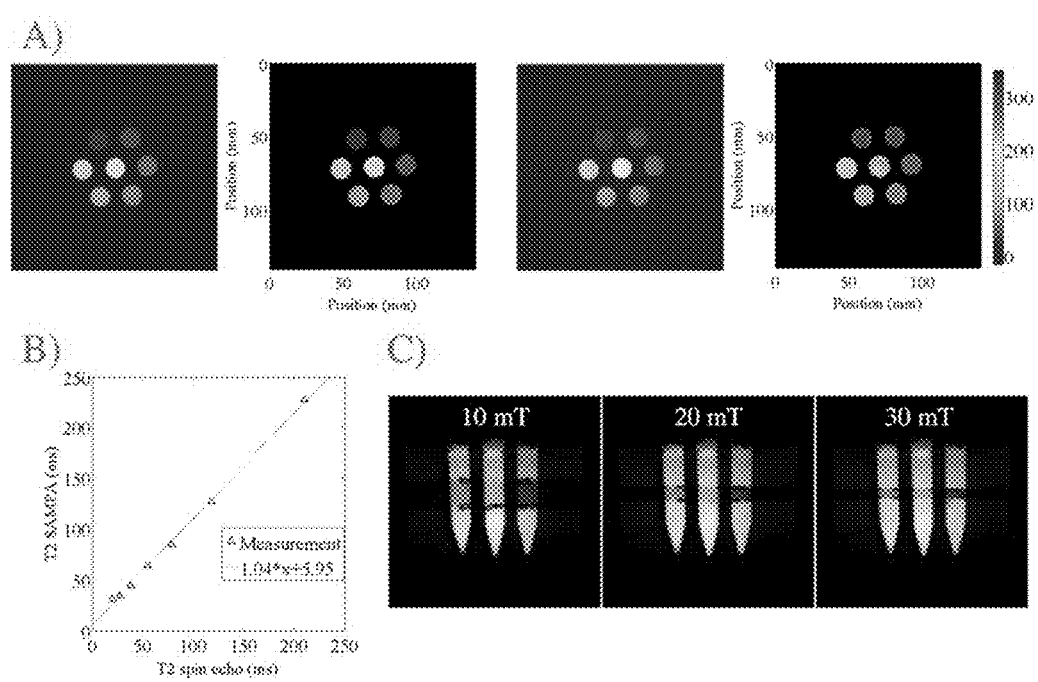
FIGS. 7A-7C illustrate phantom experiment results on agar gels of different concentrations (0.5, 1, 1.5, 2, 3, 4 and 6% agar).

FIGS. 7A and 7B show a comparison between SAMPA-FLASH and spin echo acquisitions in the agar phantom. Similar $T_2$w images and $T_2$ maps were observed between both acquisitions. There was a high correlation between $T_2$ values measured with SAMPA compared to spin echo imaging ($R^2$=0.999), and linear regression showed a linear coefficient of 1.04 and offset of 5.95 ms (95% confidence intervals 0.99-1.09 for slope and 1.37-10.52 ms for offset) (FIG. 7B).

In FIG. 7C, the slice profile achieved by SAMPA is shown for various slice selection gradients (10, 20 and 30 mT/m). $T_2$ contrast can be observed within the selected slice while FLASH contrast dominates outside the selected slice. For the SAMPA pulse design, a maximum of 35 mT/m gradient could be achieved before slew rate limitations, which corresponds to a total slice thickness of 5 mm (including oscillatory bands) and an effective inner slice thickness of 3 mm available for $T_2$w imaging.

Results—In Vivo Comparison of Different $T_2$-Prep Methods

Figures 8A, 8B, 8C, 8D:
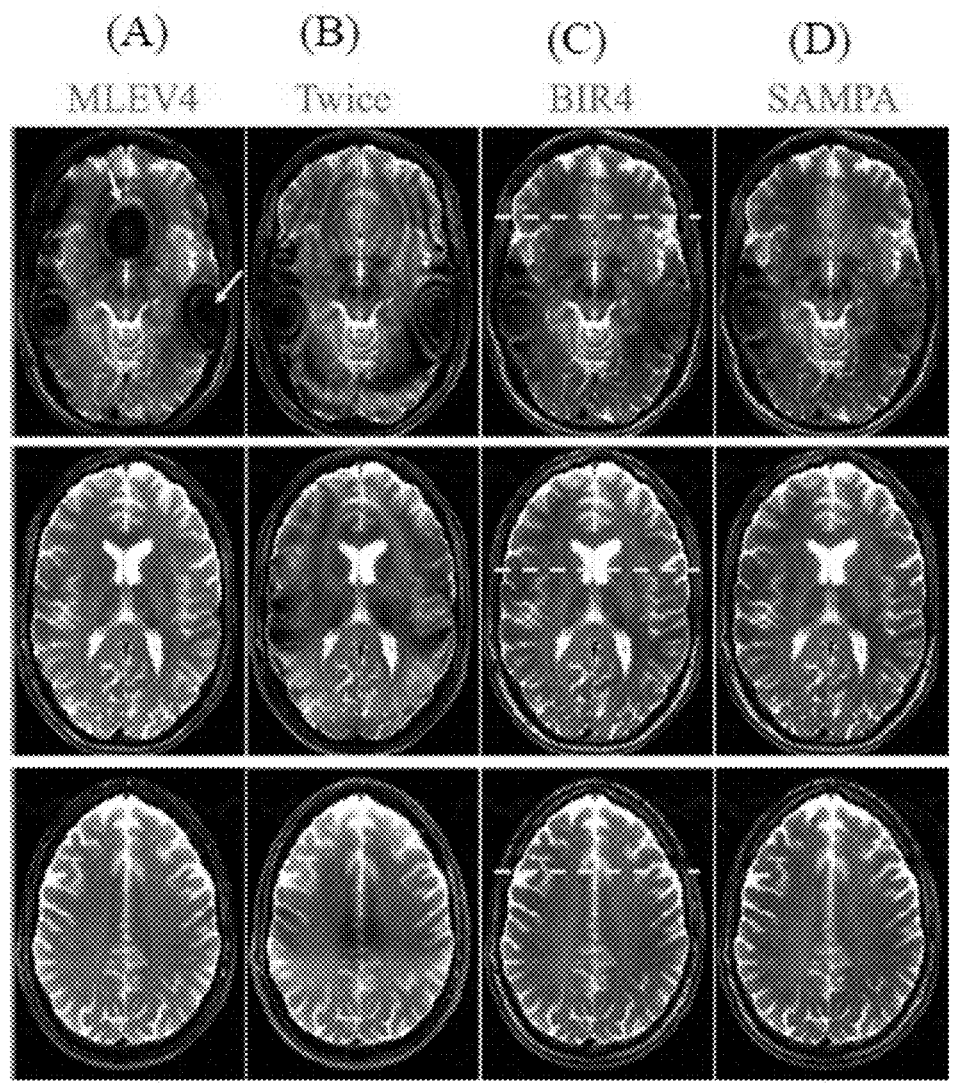
FIGS. 8A-8E illustrate a comparison of results for different $T_2$-prep methods acquired in the brain of a healthy subject: MLEV4 (FIG. 8A), twice-refocused adiabatic (FIG. 8B), BIR4 (FIG. 8C), and SAMPA (FIG. 8D), shown at 3 different slices (from top to bottom), and a comparison of the different methods for each slice (FIG. 8E).
Figure 8E:
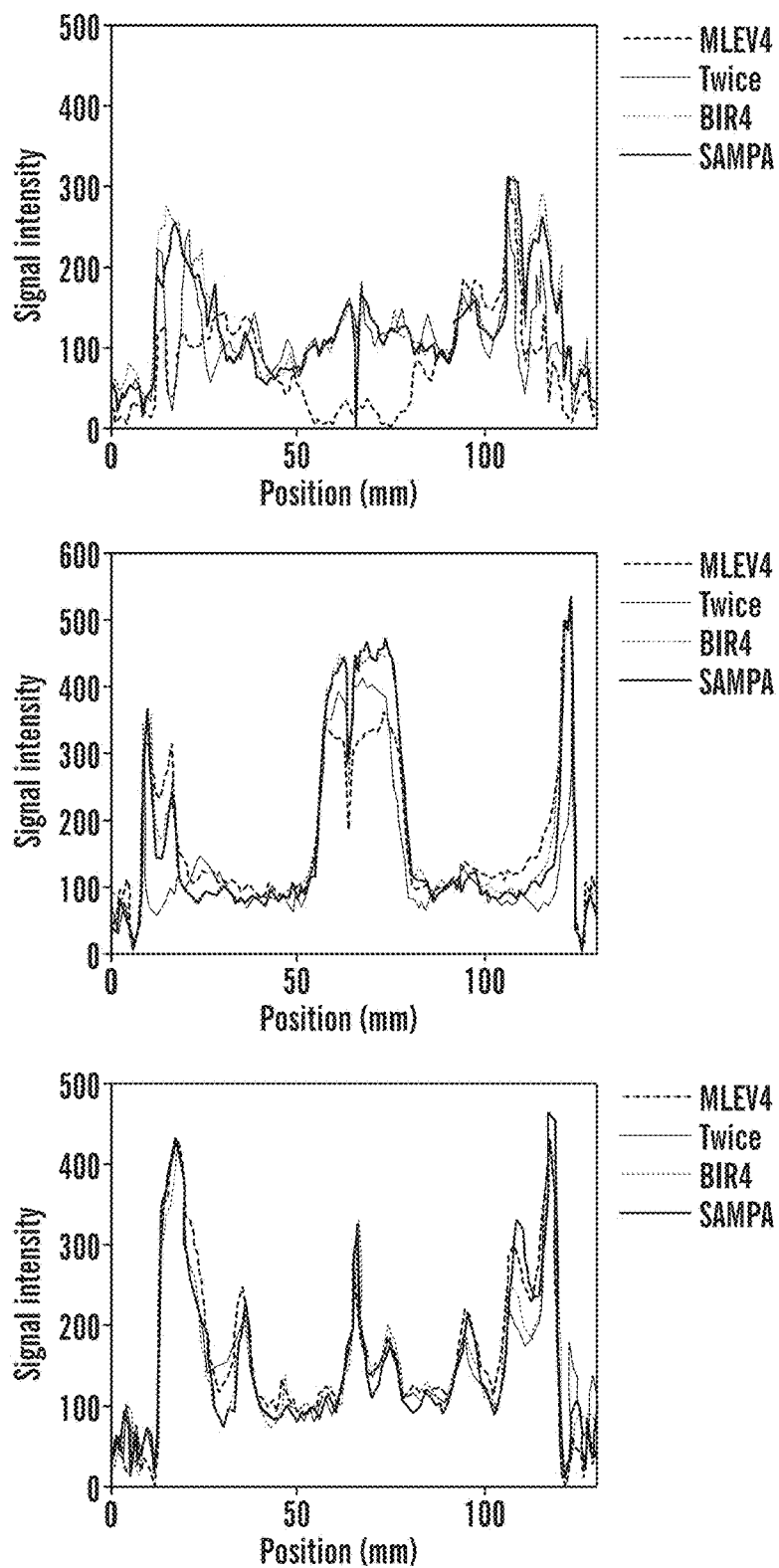

FIG. 8 shows a comparison of MLEV4, twice-refocused adiabatic, BIR4, and SAMPA $T_2$-prep modules acquired at three different slice locations in a healthy subject. Large artifacts are visible for MLEV4 and twice-refocused adiabatic modules near the prefrontal cortex and in regions close to the ear canals. BIR4 and SAMPA lead to similar image quality and increased robustness to artifacts in these regions of large $B_0$ inhomogeneity.

Results—Interleaved Multislab Acquisitions for Whole Brain $T_2$w Imaging

Figures 9A, 9B, 9C, 9D, 9E:
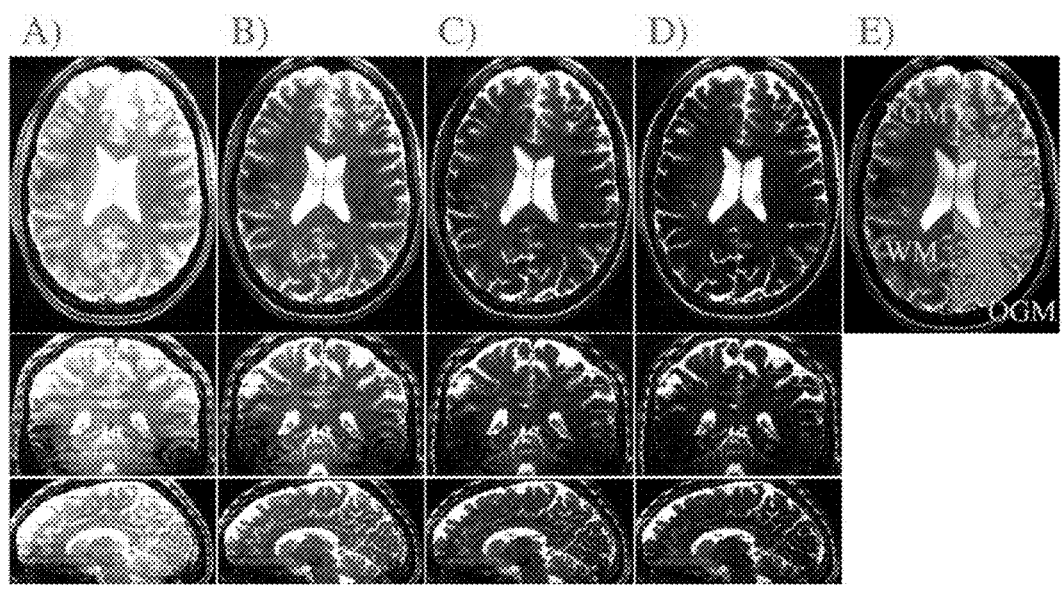
FIGS. 9A-9E illustrate a 3D multislab T2w imaging acquired at TE=25, 50, 75 and 100 ms (FIGS. 9A, 9B, 9C, and 9D respectively) with 0.8 mm3 isotropic axial acquisition, along with coronal and sagittal reformats. Residual artifacts are visible near areas of large off-resonance such as the prefrontal cortex and ear canals. E: ROI placement for T2 measurement of frontal grey matter (FGM), occipital grey matter (OGM) and white matter (WM) (FIG. 9E).
Figures 10A, 10B:
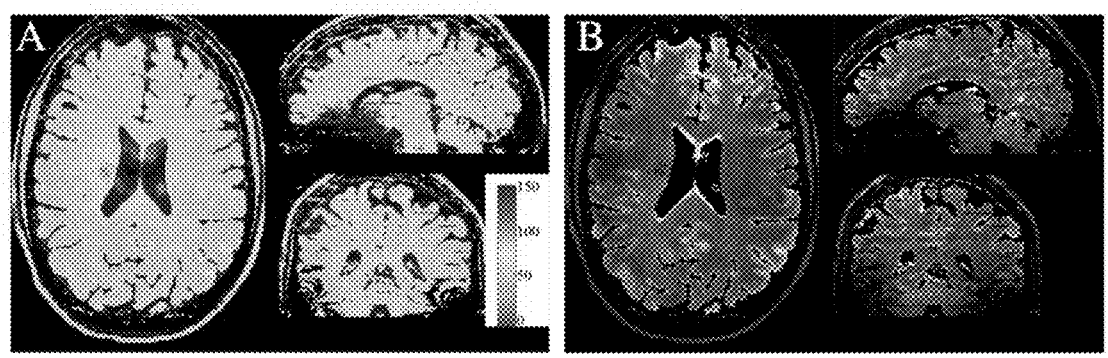
FIG. 10A illustrates $T_2$ maps derived from 0.8 mm$^3$ isotropic resolution $T_2$-weighted acquisitions shown in FIG. 9.
FIG. 10B illustrates a reconstructed fluid-suppressed $T_2$-weighted image at $T_E$=50 ms, derived by excluding regions with $T_2$>100 ms.

Full brain isotropic 0.8 mm$^3$ $T_2$w acquisitions are shown in FIG. 9. Using isotropic resolution led to high quality reformatted images in coronal and sagittal orientations. Residual artifacts are visible near areas of large $B_0$ inhomogeneity such as the temporal lobe and prefrontal cortex. Interslab artifacts due to FLASH readout excitation are also visible on the reformatted series. Derived $T_2$ maps are shown in FIG. 10A. Fast measurement of $T_2$ allows for more quantitative analysis of tissue properties in different regions of the brain.

$T_2$ was measured using segmentation-grown regions of interest placed in the frontal grey matter, occipital grey matter, and white matter (ROIs are shown on FIG. 9E) leading to values of 62.8, 51.7 and 46.5 ms respectively. Finally, FIG. 10B shows a recomposed CSF-suppressed image derived by excluding higher $T_2$ components ($T_2$>100 ms) from the $T_E$=50 ms volume.

Accordingly, the performance of SAMPA for $T_2$w imaging has been demonstrated in the phantom experiments as well as in the brains of healthy volunteers at 7 T. The simulations indicate that the proposed design operates at peak B1 of 15 μT and higher, within a 400 Hz bandwidth. The $T_2$ values were in strong agreement with spin echo-based $T_2$ mapping in the phantom experiments. Whole brain, interleaved multislab 3D imaging could be acquired with 0.8 $mm^3$ isotropic resolution in 5:36 min per $T_2$ weighting. Further, compared with prior adiabatic $T_2$ preparation techniques, SAMPA allows for slice-selectivity, which can lead to efficient and robust acquisitions for T2w imaging at high field

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order.

What is claimed is:

1. A method for generating a magnetic resonance image based on a slice-selective adiabatic magnetization $T_2$ preparation pulse, the method comprising:
   generating, by a magnetic resonance imaging computing device, a pulse control signal comprising an adiabatic half passage pulse control signal, an adiabatic full passage pulse control signal, and a reverse adiabatic half passage pulse control signal;
   generating, by the magnetic resonance imaging computing device, a plurality of slice-selective linear phase subpulse control signals;
   sampling, by the magnetic resonance imaging computing device, the pulse control signal using the plurality of slice-selective linear phase subpulse control signals to generate a slice-selective adiabatic $T_2$ preparation control signal;
   generating, by the magnetic resonance imaging computing device, an alternating polarity gradient pulse control signal for the slice-selective adiabatic $T_2$ preparation pulse;
   outputting, by the magnetic resonance imaging computing device, the slice-selective adiabatic $T_2$ preparation control signal to a waveform generator to produce the slice-selective adiabatic $T_2$ preparation pulse;
   outputting, by the magnetic resonance imaging computing device, an image sequence based on the slice-selective adiabatic $T_2$ preparation pulse and the alternating polarity gradient pulse control signal; and
   generating, by the magnetic resonance imaging computing device, a magnetic resonance image based on the image sequence.

2. The method as set forth in claim 1, wherein the pulse control signal comprises a $B_1$ insensitive rotation pulse control signal.

3. The method as set forth in claim 1, wherein the pulse control signal has a duration of 24 ms.

4. The method as set forth in claim 1, wherein the adiabatic full passage pulse control signal comprises a 180 degree Shinnar-Le Roux pulse control signal.

5. The method as set forth in claim 1, wherein the adiabatic full passage control signal comprises a duration of 12 ms and a bandwidth of 960 Hz.

6. The method as set forth in claim 1, wherein the plurality of slice-selective linear phase subpulse control signals comprise at least forty four slice-selective linear phase subpulse control signals.

7. The method as set forth in claim 1, wherein the plurality of slice-selective linear phase subpulse control signals comprise Hamming-windowed sinc pulse control signals.

8. The method as set forth in claim 7, wherein the Hamming-windowed sinc pulse control signals comprise a time bandwidth product of one.

9. The method as set forth in claim 1, wherein the slice-selective adiabatic $T_2$ preparation control signal comprises a bandwidth of 1.83 kHz.

10. The method of claim 1, wherein the slice-selective adiabatic $T_2$ preparation pulse operates at a null flip angle.

11. The method of claim 1, wherein the slice-selective adiabatic $T_2$ preparation pulse comprises one or more waiting periods configured to provide an echo time.

12. A magnetic resonance imaging computing device comprising:
   at least one processor;
   and a memory coupled to the processor which is configured to be capable of executing programmed instructions comprising and stored in the memory to:
      generate a pulse control signal comprising an adiabatic half passage pulse control signal, an adiabatic full passage pulse control signal, and a reverse adiabatic half passage pulse control signal;
      generate a plurality of slice-selective linear phase subpulse control signals;
      sample the pulse control signal using the plurality of slice-selective linear phase subpulse control signals to generate a slice-selective adiabatic $T_2$ preparation control signal;
      generate an alternating polarity gradient pulse control signal for the slice-selective adiabatic $T_2$ preparation pulse;
      output the slice-selective adiabatic $T_2$ preparation control signal to a waveform generator to produce the slice-selective adiabatic $T_2$ preparation pulse;
      output an image sequence based on the slice-selective adiabatic $T_2$ preparation pulse and the alternating polarity gradient pulse control signal; and
      generate a magnetic resonance image based on the image sequence.

13. The device as set forth in claim 12, wherein the pulse control signal comprises a $B_1$ insensitive rotation pulse control signal.

14. The device as set forth in claim 12, wherein the pulse control signal has a duration of 24 ms.

15. The device as set forth in claim 12, wherein the adiabatic full passage pulse control signal comprises a 180 degree Shinnar-Le Roux pulse control signal.

16. The device as set forth in claim 12, wherein the adiabatic full passage control signal comprises a duration of 12 ms and a bandwidth of 960 Hz.

17. The device as set forth in claim 12, wherein the plurality of slice-selective linear phase subpulse control signals comprise at least forty four slice-selective linear phase subpulse control signals.

18. The device as set forth in claim 12, wherein the plurality of slice-selective linear phase subpulse control signals comprise Hamming-windowed sinc pulse control signals.

19. The device as set forth in claim 18, wherein the Hamming-windowed sinc pulse control signals comprise a time bandwidth product of one.

20. The device as set forth in claim 12, wherein the slice-selective adiabatic $T_2$ preparation control signal comprises a bandwidth of 1.83 kHz.

21. The device of claim 12, wherein the slice-selective adiabatic $T_2$ preparation pulse operates at a null flip angle.

22. The device of claim 12, wherein the slice-selective adiabatic $T_2$ preparation pulse comprises one or more waiting periods configured to provide an echo time.

23. A non-transitory computer readable medium having stored thereon instructions for generating a magnetic resonance image based on a slice-selective adiabatic magnetization $T_2$ preparation pulse comprising executable code which when executed by a processor, causes the processor to perform steps comprising:

generating a pulse control signal comprising an adiabatic half passage pulse control signal, an adiabatic full passage pulse control signal, and a reverse adiabatic half passage pulse control signal;

generating a plurality of slice-selective linear phase subpulse control signals;

sampling the pulse control signal using the plurality of slice-selective linear phase subpulse control signals to generate a slice-selective adiabatic $T_2$ preparation control signal;

generating an alternating polarity gradient pulse control signal for the slice-selective adiabatic $T_2$ preparation pulse;

outputting the slice-selective adiabatic $T_2$ preparation control signal to a waveform generator to produce the slice-selective adiabatic $T_2$ preparation pulse;

outputting an image sequence based on the slice-selective adiabatic $T_2$ preparation pulse and the alternating polarity gradient pulse control signal; and generating a magnetic resonance image based on the image sequence.

24. The medium as set forth in claim 23, wherein the pulse control signal comprises a $B_1$ insensitive rotation pulse control signal.

25. The medium as set forth in claim 23, wherein the pulse control signal has a duration of 24 ms.

26. The medium as set forth in claim 23, wherein the adiabatic full passage pulse control signal comprises a 180 degree Shinnar-Le Roux pulse control signal.

27. The medium as set forth in claim 23, wherein the adiabatic full passage control signal comprises a duration of 12 ms and a bandwidth of 960 Hz.

28. The medium as set forth in claim 23, wherein the plurality of slice-selective linear phase subpulse control signals comprise at least forty four slice-selective linear phase subpulse control signals.

29. The medium as set forth in claim 23, wherein the plurality of slice-selective linear phase subpulse control signals comprise Hamming-windowed sinc pulse control signals.

30. The medium as set forth in claim 29, wherein the Hamming-windowed sinc pulse control signals comprise a time bandwidth product of one.

31. The medium as set forth in claim 23, wherein the slice-selective adiabatic $T_2$ preparation control signal comprises a bandwidth of 1.83 kHz.

32. The medium of claim 23, wherein the slice-selective adiabatic $T_2$ preparation pulse operates at a null flip angle.

33. The medium of claim 23, wherein the slice-selective adiabatic $T_2$ preparation pulse comprises one or more waiting periods configured to provide an echo time.

* * * * *